(12) United States Patent
Chin et al.

(10) Patent No.: US 10,176,926 B2
(45) Date of Patent: Jan. 8, 2019

(54) COMPOSITE ELECTRONIC COMPONENT

(71) Applicant: SAMSUNG ELECTRO-MECHANICS CO., LTD., Suwon-si, Gyeonggi-do (KR)

(72) Inventors: Seong Min Chin, Suwon-si (KR); Je Ik Moon, Suwon-si (KR); Ye Eun Jung, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 314 days.

(21) Appl. No.: 15/133,827

(22) Filed: Apr. 20, 2016

(65) Prior Publication Data
US 2016/0343509 A1   Nov. 24, 2016

(30) Foreign Application Priority Data

May 19, 2015   (KR) ..................... 10-2015-0069720

(51) Int. Cl.
*H01G 4/40* (2006.01)
*H01F 27/28* (2006.01)
(Continued)

(52) U.S. Cl.
CPC ........... *H01G 4/40* (2013.01); *H01F 17/0013* (2013.01); *H01F 17/0033* (2013.01);
(Continued)

(58) Field of Classification Search
CPC . H01G 4/30; H01G 4/40; H01G 4/228; H01F 17/0013; H01F 17/0033; H01F 27/292; H01F 27/2804; H05K 1/181; H05K 3/3442; H05K 2201/10015; H05K 2201/1003; H05K 2201/10537; H05K 2201/10636; Y02P 70/611; H02M 3/04
(Continued)

(56) References Cited

U.S. PATENT DOCUMENTS 4,943,604 A * 7/1990 Okuri ..................... C08G 59/02
                                                      523/428
5,610,565 A * 3/1997 Maeda ................. H03H 1/0007
                                                      333/181

(Continued)

FOREIGN PATENT DOCUMENTS

JP          6-325977 A      11/1994
JP          8-143639 A       6/1996
(Continued)

*Primary Examiner* — Kevin J Comber
(74) *Attorney, Agent, or Firm* — McDermott Will & Emery LLP

(57) ABSTRACT

A composite electronic component includes a composite body in which a capacitor and an inductor are coupled to each other, the capacitor including a ceramic body in which a plurality of dielectric layers and first and second internal electrodes disposed to face each other with at least one among the plurality of dielectric layers interposed therebetween are stacked, and the inductor including a magnetic body including a coil part. The inductor and the capacitor are coupled to each other by an adhesive containing a first epoxy resin including a urethane modified epoxy (UME) resin, a second epoxy resin including a bisphenol A type resin, and a latent curing agent.

16 Claims, 9 Drawing Sheets

(51) Int. Cl.
  *H01F 27/29* (2006.01)
  *H01G 4/30* (2006.01)
  *H02M 3/04* (2006.01)
  *H05K 1/18* (2006.01)
  *H01F 17/00* (2006.01)
  *H01G 4/228* (2006.01)
  *H05K 3/34* (2006.01)

(52) U.S. Cl.
  CPC ............ *H01F 27/292* (2013.01); *H01G 4/30* (2013.01); *H05K 1/181* (2013.01); *H01G 4/228* (2013.01); *H05K 3/3442* (2013.01); *H05K 2201/1003* (2013.01); *H05K 2201/10015* (2013.01); *H05K 2201/10537* (2013.01); *H05K 2201/10636* (2013.01); *Y02P 70/611* (2015.11)

(58) Field of Classification Search
  USPC ........................................................ 361/270
  See application file for complete search history.

(56) References Cited

U.S. PATENT DOCUMENTS

| | | | |
|---|---|---|---|
| 5,700,884 | A | 12/1997 | Kokura et al. |
| 6,438,000 | B1* | 8/2002 | Okamoto ............... H02M 1/12 333/185 |
| 2003/0030510 | A1 | 2/2003 | Sasaki et al. |
| 2008/0254968 | A1* | 10/2008 | Kakuda ................ C04B 35/465 501/137 |
| 2010/0196689 | A1* | 8/2010 | Fujii ........................ B32B 5/18 428/220 |
| 2014/0220364 | A1* | 8/2014 | Umemoto ............... C03C 14/00 428/434 |
| 2015/0109074 | A1 | 4/2015 | Son et al. |

FOREIGN PATENT DOCUMENTS

| | | |
|---|---|---|
| KR | 2003-0014586 A | 2/2003 |
| KR | 10-2008-0053038 A | 6/2008 |
| KR | 10-2010-0049846 A | 5/2010 |
| KR | 10-1514554 B1 | 4/2015 |

* cited by examiner

COMPOSITE ELECTRONIC COMPONENT

CROSS-REFERENCE TO RELATED APPLICATION

This application claims the benefit of priority to Korean Patent Application No. 10-2015-0069720, filed on May 19, 2015 with the Korean Intellectual Property Office, the entirety of which is incorporated herein by reference.

TECHNICAL FIELD

The present disclosure relates to a composite electronic component including a plurality of passive elements and a board having the same.

BACKGROUND

In accordance with recent demand for increased thinness and lightness of electronic devices, as well as improved performance, electronic devices have been desired that have significantly decreased size and improved functionality.

Electronic devices as described above include a power semiconductor based power management integrated circuit (PMIC), which serves to efficiently control and manage a limited battery resource in order to satisfy various service requirements.

However, as the electronic device performs multiple functions, the number of direct current (DC)/DC converters included in the PMIC has increased, and the number of passive elements that should be included in a power input terminal and a power output terminal of the PMIC has also increased.

In this case, a component disposition area of the electronic device must be increased, which may limit the ability to miniaturize the electronic device.

In addition, significant noise may be generated due to wiring patterns and peripheral circuits of the PMIC.

In order to solve the above-mentioned problems, research into a composite electronic component in which an inductor and a capacitor are coupled to each other has been conducted, and thus effects such as a decrease in a component disposition area in the electronic device and suppression of noise generation have been obtained.

When the inductor and the capacitor are coupled to each other as described above, an adhesive may be used, and thus research into a composition of the adhesive has been pursued in order to improve workability of coupling the components, coupling strength, and productivity.

SUMMARY

An aspect of the present disclosure provides a composite electronic component capable of decreasing a component mounting area in a driving power supply system, and a board having the same.

An aspect of the present disclosure also provides a composite electronic component capable of suppressing noise from being generated in a driving power supply system, and a board having the same.

According to an aspect of the present disclosure, a composite electronic component includes: a composite body in which a capacitor and an inductor are coupled to each other, the capacitor including a ceramic body in which a plurality of dielectric layers and first and second internal electrodes disposed to face each other with each of the dielectric layers interposed therebetween are stacked, and the inductor including a magnetic body including a coil part; an input terminal disposed on a first end surface of the composite body in a length direction and connected to the coil part of the inductor; an output terminal including a first output terminal disposed on a second end surface of the composite body in the length direction and connected to the coil part of the inductor and a second output terminal disposed on the second end surface of the composite body in the length direction and connected to the first internal electrodes of the capacitor; and a ground terminal disposed on the first end surface of the composite body in the length direction and connected to the second internal electrodes of the capacitor, wherein the inductor and the capacitor are coupled to each other by an adhesive containing a first epoxy resin including a urethane modified epoxy (UME) resin, a second epoxy resin including a bisphenol A type resin, and a latent curing agent.

The capacitor may be coupled to a side surface of the inductor.

According to another aspect of the present disclosure, a composite electronic component includes: an input terminal receiving power converted by a power management part; the power stabilization part stabilizing the power and including a composite body in which a capacitor and an inductor are coupled to each other, the capacitor including a ceramic body in which a plurality of dielectric layers and first and second internal electrodes disposed to face each other with each of the dielectric layers interposed therebetween are stacked, the inductor including a magnetic body including a coil part, and the inductor and the capacitor being coupled by an adhesive containing a first epoxy resin including a urethane modified epoxy (UME) resin, a second epoxy resin including a bisphenol A type resin, and a latent curing agent; an output terminal supplying the stabilized power; and a ground terminal for grounding.

According to another aspect of the present disclosure, a board having a composite electronic component includes: a printed circuit board on which three or more electrode pads are formed; the composite electronic component as described above, mounted on the printed circuit board; and solders connecting the electrode pads and the composite electronic component to each other.

BRIEF DESCRIPTION OF DRAWINGS

The above and other aspects, features, and advantages of the present disclosure will be more clearly understood from the following detailed description taken in conjunction with the accompanying drawings.

DETAILED DESCRIPTION

Figure 1:
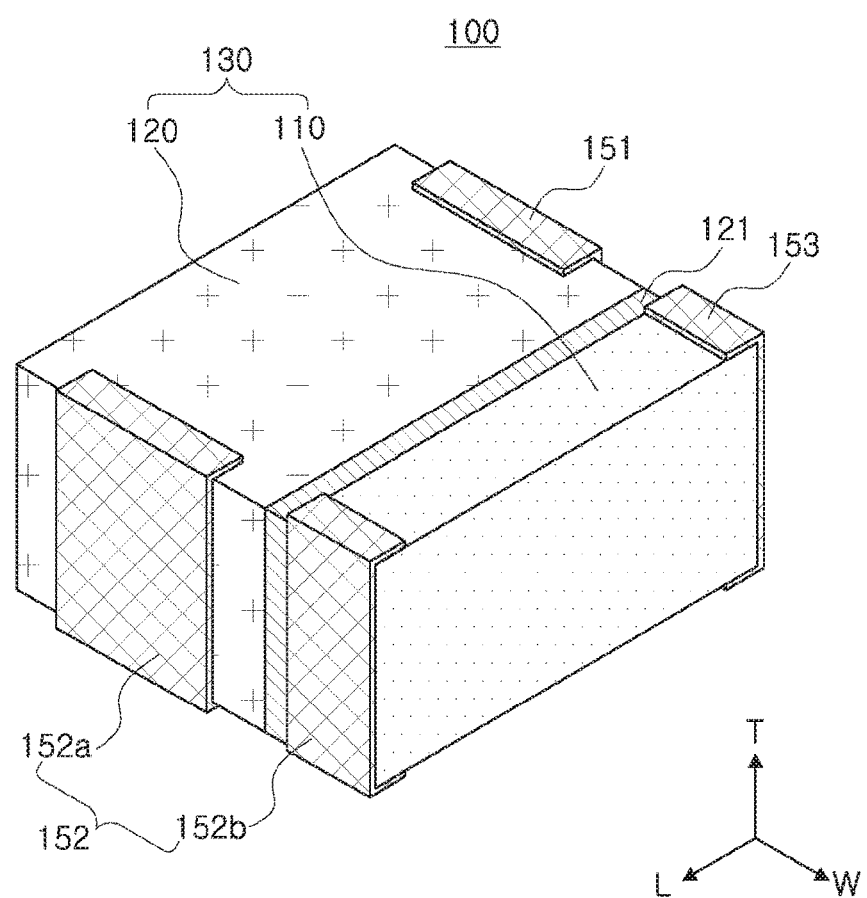
FIG. 1 is a perspective diagram schematically illustrating a composite electronic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

FIG. 1 is a perspective diagram schematically illustrating a composite electronic component according to an exemplary embodiment.

Figure 2:
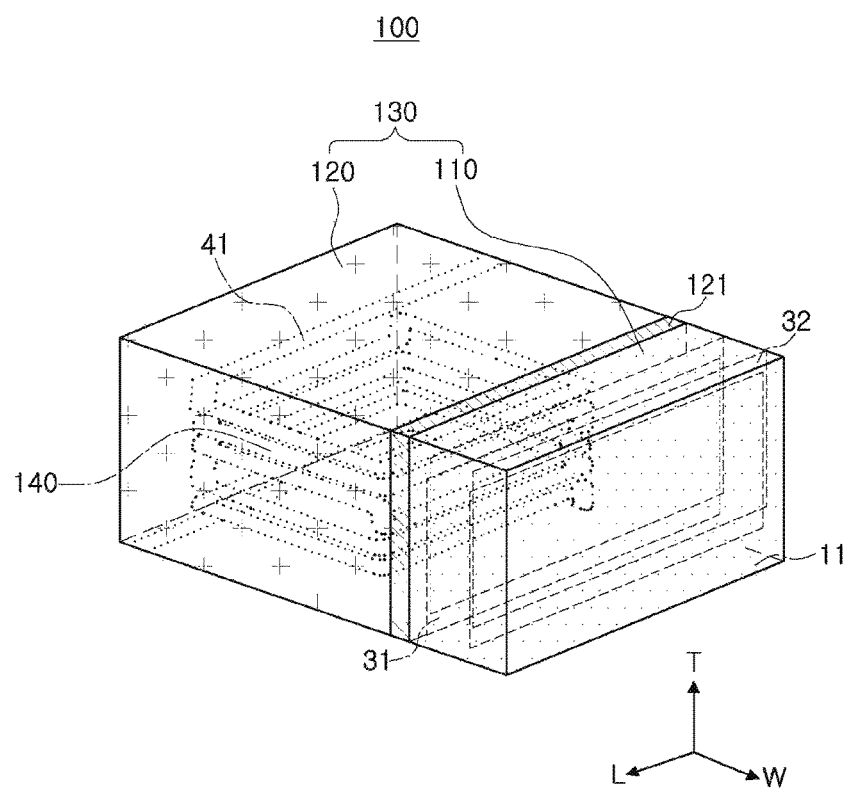
FIG. 2 is a schematic perspective diagram illustrating an internal portion of a composite electronic component according to a first exemplary embodiment in the present disclosure, as illustrated in FIG. 1.

FIG. 2 is a schematic perspective diagram illustrating an internal portion of a composite electronic component according to a first exemplary embodiment, as illustrated in FIG. 1.

Figure 3:
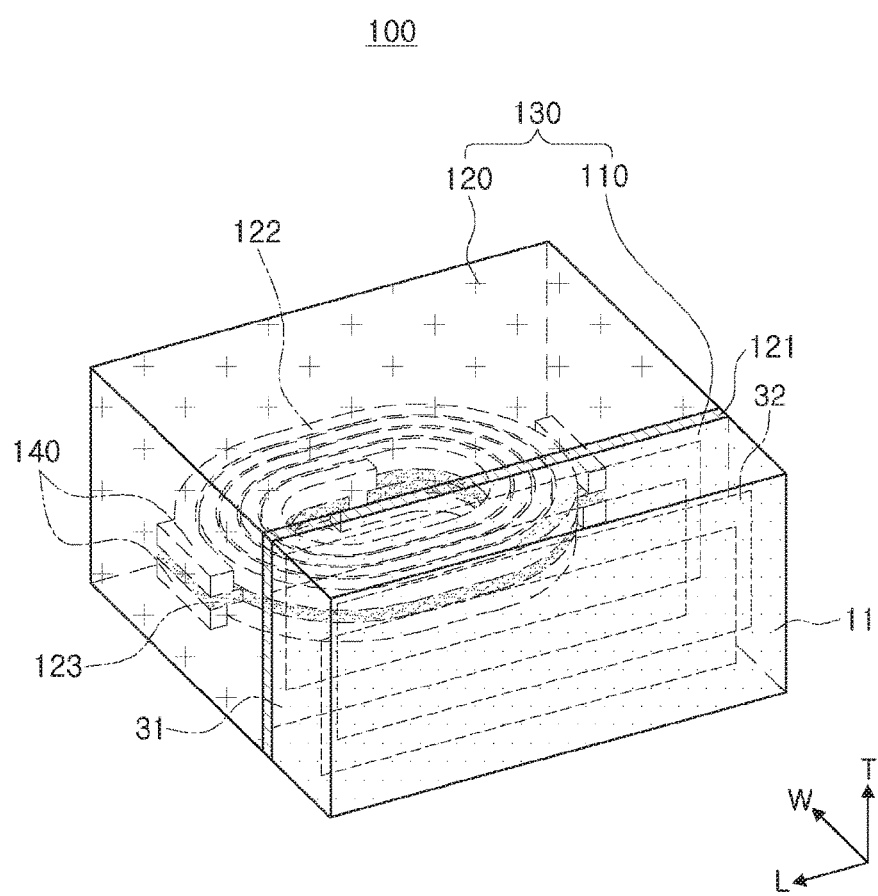
FIG. 3 is a schematic perspective diagram illustrating an internal portion of a composite electronic component according to a second exemplary embodiment in the present disclosure, as illustrated in FIG. 1.

FIG. 3 is a schematic perspective diagram illustrating an internal portion of a composite electronic component according to a second exemplary embodiment, as illustrated in FIG. 1.

Figure 4:
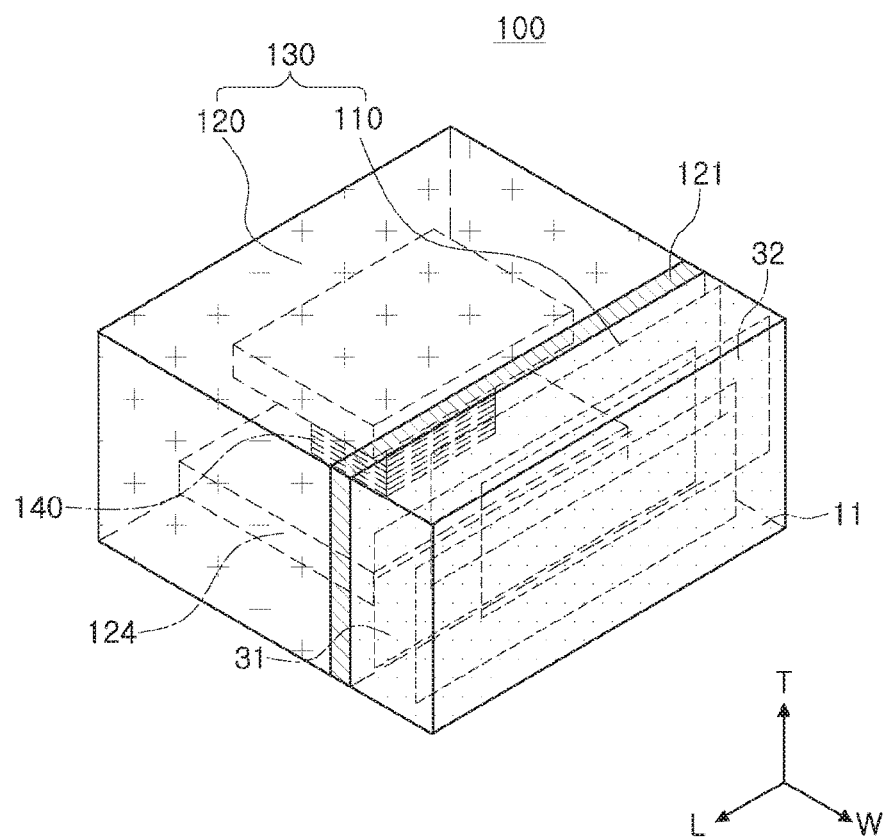
FIG. 4 is a schematic perspective diagram illustrating an internal portion of a composite electronic component according to a third exemplary embodiment in the present disclosure, as illustrated in FIG. 1.

FIG. 4 is a schematic perspective diagram illustrating an internal portion of a composite electronic component according to a third exemplary embodiment, as illustrated in FIG. 1.

Figure 5:
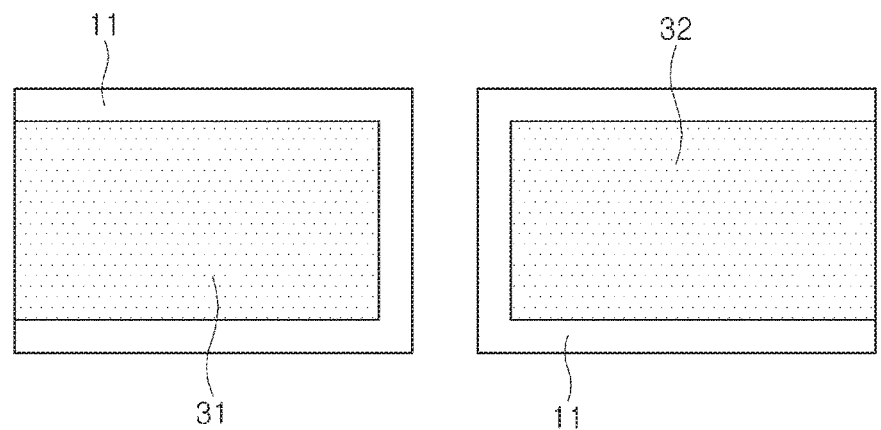
FIG. 5 is a plan diagram illustrating internal electrodes applicable to a multilayer ceramic capacitor of the composite electronic component illustrated in FIG. 1.

FIG. 5 is a plan diagram illustrating internal electrodes applicable to a multilayer ceramic capacitor of the composite electronic component illustrated in FIG. 1.

Referring to FIG. 1, in the composite electronic component according to the exemplary embodiment, a 'length direction' refers to an 'L' direction of FIG. 1, a 'width direction' refers to a 'W' direction of FIG. 1, and a 'thickness direction' refers to a 'T' direction of FIG. 1. In another embodiment, the 'thickness direction' may be the same as a direction in which dielectric layers of a capacitor are stacked, that is, a 'stacking direction'.

The length, width, and thickness directions of the composite electronic component may be the same as length, width, and thickness directions of a capacitor and an inductor, respectively, as described below.

In addition, in the present exemplary embodiment, the composite electronic component may have upper and lower surfaces opposing each other, and first and second end surfaces in the length direction and first and second side surfaces in the width direction that connect the upper and lower surfaces to each other. A shape of the composite electronic component is not particularly limited, but may be a hexahedral shape as illustrated.

Further, the first and second end surfaces of the composite electronic component in the length direction and the first and second side surfaces thereof in the width direction may be defined as surfaces in the same directions as directions of first and second end surfaces of the capacitor and the inductor in the length direction and first and second side surfaces of the capacitor and the inductor in the width direction, respectively, as described below.

The composite electronic component may have a form in which the capacitor and the inductor are coupled to each other. When the capacitor is coupled to the side surface of the inductor, the upper surface of the composite electronic component may be defined as upper surfaces of the inductor and the capacitor, and the lower surface of the composite electronic component may be defined as lower surfaces of the inductor and the capacitor.

Referring to FIGS. 1 through 5, a composite electronic component 100 according to an exemplary embodiment may include a composite body 130 including a capacitor 110 and an inductor 120 coupled to each other, wherein the capacitor 110 includes a ceramic body in which a plurality of dielectric layers 11 and first and second internal electrodes 31 and 32 disposed so as to face each other with each of the dielectric layers 11 interposed therebetween are stacked, and the inductor 120 includes a magnetic body including a coil part 140.

In the present exemplary embodiment, the composite body 130 may have upper and lower surfaces opposing each other, and first and second end surfaces in the length direction and first and second side surfaces in the width direction, which connect the upper and lower surfaces to each other.

A shape of the composite body 130 is not particularly limited, but may be a hexahedral shape as illustrated.

According to the exemplary embodiment, the capacitor 110 may be coupled to the side surface of the inductor 120, but is not limited thereto. That is, the capacitor may be variously disposed.

The composite body 130 may be formed by coupling the capacitor 110 and the inductor 120, and a method of forming the composite body 130 is not particularly limited.

According to the exemplary embodiment, the inductor 120 and the capacitor 110 may be coupled to each other by an adhesive 121 containing a first epoxy resin containing a urethane modified epoxy (UME) resin, a second epoxy resin containing a bisphenol A type resin, and a latent curing agent.

The adhesive 121 may contain the urethane modified epoxy (UME) resin, and thus mechanical strength may be excellent after curing the adhesive 121, and even after reflow, mechanical strength may not be decreased.

The excellent mechanical strength after curing the adhesive and lack of decrease in mechanical strength even after reflow is due to the fact that the urethane modified epoxy (UME) resin has high thermal resistance.

Meanwhile, the adhesive 121 may contain the bisphenol A type resin, wherein the bisphenol A type resin may be, for example, bisphenol A diglycidyl ether, but is not necessarily limited thereto.

The bisphenol A diglycidyl ether resin may be represented by the following Chemical Formula 1.

[Chemical Formula 1]

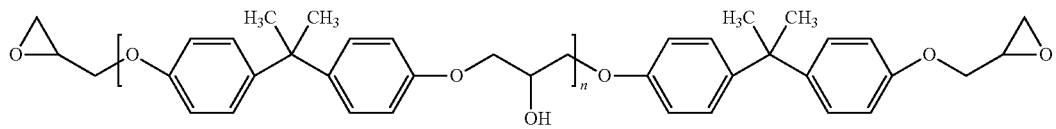

The adhesive 121 may contain the bisphenol A type resin, particularly, bisphenol A diglycidyl ether, and thus, at the time of adhesion, workability may be excellent.

Generally, when using only an epoxy resin having high strength and high thermal resistance as a means of coupling components, viscosity may be significantly increased by increasing the number of aromatic rings. Therefore, a problem may occur in workability due to limitations in rheological properties at the time of adhesion.

However, the inductor and the capacitor may be coupled to each other using the adhesive further containing the bisphenol A type resin having excellent flexibility as in the exemplary embodiment, and thus, at the time of adhesion, workability may be excellent.

Contents of the first epoxy resin containing the urethane modified epoxy (UME) resin and the second epoxy resin containing the bisphenol A type resin are not particularly limited. For example, the first epoxy resin and the second epoxy resin may be contained at a content ratio of 50:50 to 90:10.

In order to further improve the workability at the time of adhesion, the first epoxy resin and the second epoxy resin may be contained at a content ratio of 50:50, and in order to further secure coupling strength and high thermal resistance, the first epoxy resin and the second epoxy resin may be contained at a content ratio of 90:10. However, the content ratio is not necessarily limited thereto, and may be adjusted.

In the composite electronic component according to the exemplary embodiment, the adhesive 121 may contain a latent curing agent.

The latent curing agent may be dicyandiamide having excellent reactivity with the first and second epoxy resins, but is not necessarily limited thereto.

Dicyandiamide may be represented by the following [Chemical Formula 2].

[Chemical Formula 2]

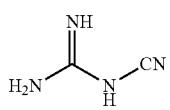

Since a curing rate of the latent curing agent, which may be dicyandiamide, may be significantly slow when a heat source is not supplied, the latent curing agent may significantly suppress a time-dependent change in viscosity after preparing an epoxy adhesive composition.

The latent curing agent may enable automation and mechanization in an adhesion process line due to a long pot life as described above, and the epoxy adhesion composition may be preserved for a long period of time, and thus a variation between lots at the time of manufacturing may be decreased.

The latent curing agent may be contained at a content at which the latent curing agent may cure the first and second epoxy resins, and the content may be variously applied depending on a process.

Meanwhile, according to the exemplary embodiment, the adhesive 121 may further contain an imidazole based curing accelerator.

The imidazole based curing accelerator is not particularly limited, but may be, for example, 2-ethyl-4-methylimidazole (2E4MZ).

2-ethyl-4-methylimidazole (2E4MZ), which is the imidazole based curing accelerator, may be represented by the following [Chemical Formula 3].

[Chemical Formula 3]

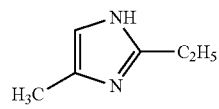

According to the exemplary embodiment, the adhesive 121 may further contain the imidazole based curing accelerator, particularly, 2-ethyl-4-methylimidazole (2E4MZ), and thus curing may be rapidly performed when the heat source is supplied.

That is, since the adhesive 121 uses the latent curing agent in order to secure a long pot life, when the heat source is supplied after applying the adhesive on an adhesion surface of the inductor and the capacitor, the curing should be rapidly performed, and the composite electronic component should be maintained in an adhesion state.

Therefore, the adhesive 121 may further contain the imidazole based curing accelerator, particularly, 2-ethyl-4-methylimidazole (2E4MZ), whereby a curing rate of the adhesive may be increased, and thus, adhesion strength of the inductor and the capacitor may be improved.

Hereinafter, the capacitor 110 and the inductor 120 constituting the composite body 130 will be described in detail.

According to the exemplary embodiment, the magnetic body constituting the inductor 120 may include the coil part 140.

The inductor 120 is not particularly limited. For example, the inductor 120 may be a multilayer type inductor, a thin film type inductor, or a winding type inductor.

The multilayer type inductor may be manufactured by thickly printing electrodes on thin ferrite or glass ceramic sheets, stacking several sheets on which a coil pattern is printed, and connecting internal conducting wires to each other through via-holes.

The thin film type inductor may be manufactured by forming coil conducting wires on a ceramic substrate by thin film sputtering or plating and providing a ferrite material.

The winding type inductor may be manufactured by winding wires (coil conducting wires) around a core.

Referring to FIG. 2, in a composite electronic component according to a first exemplary embodiment, the inductor 120 may be a multilayer type inductor.

In detail, the magnetic body may include a plurality of stacked magnetic layers 21 having conductive patterns 41 formed thereon, wherein the conductive patterns 41 may configure the coil part 140.

Referring to FIG. 3, in a composite electronic component according to a second exemplary embodiment, the inductor 120 may be a thin film type inductor.

In detail, the inductor 120 may have a thin film form in which the magnetic body includes an insulating substrate 123 and coils formed on at least one surface of the insulating substrate 123.

The magnetic body may be formed by filling upper and lower portions of the insulating substrate 123 having the coils formed on at least one surface thereof with magnetic materials 122.

Referring to FIG. 4, in a composite electronic component according to a third exemplary embodiment, the inductor 120 may be the winding type inductor.

In detail, in the inductor 120, the magnetic body may have a form in which a core 124 and winding coils wound around the core 124 are included.

Referring to FIGS. 2 through 4, the first and second internal electrodes 31 and 32 of the capacitor 110 may be stacked in a form in which they are perpendicular to a mounting surface, but are not limited thereto. That is, the first and second internal electrodes 31 and 32 may also be stacked in a form in which they are parallel to the mounting surface.

The magnetic layer 21 and the magnetic material 122 may be formed of an Ni—Cu—Zn based material, an Ni—Cu—Zn—Mg based material, or an Mn—Zn ferrite based material, but are not limited thereto.

According to the exemplary embodiment, the inductor 120 may be a power inductor that may be applied to a large amount of current.

The power inductor may be defined as a high efficiency inductor of which a change in inductance is low when a direct current is applied thereto, as compared to a general inductor. That is, it may be considered that the power inductor has DC bias characteristics (a change in inductance depending on application of a direct current) in addition to functions of a general inductor.

That is, the composite electronic component according to the exemplary embodiment may be used in a power management integrated circuit (PMIC) that includes the power inductor, which is a high efficiency inductor of which an inductance change is smaller when the DC current is applied thereto, rather than a general inductor.

The ceramic body constituting the capacitor 110 may be formed by stacking a plurality of dielectric layers 11, and a plurality of internal electrodes 31 and 32 (sequentially first and second internal electrodes) may be separately disposed in the ceramic body with dielectric layers interposed therebetween.

The dielectric layer 11 may be formed by sintering a ceramic green sheet containing ceramic powder, an organic solvent, and an organic binder. The ceramic powder, which is a material having high permittivity, may be a barium titanate ($BaTiO_3$) based material, a strontium titanate ($SrTiO_3$) based material, or the like, but is not limited thereto.

According to the exemplary embodiment, the first and second internal electrodes 31 and 32 may be exposed to the second and first end surfaces of the composite body 130 in the length direction, respectively, but are not limited thereto.

According to the exemplary embodiment, the first and second internal electrodes 31 and 32 may be formed of a conductive paste containing a conductive metal.

The conductive metal may be nickel (Ni), copper (Cu), palladium (Pd), or alloys thereof, but is not limited thereto.

The first and second internal electrodes 31 and 32 may be printed on the ceramic green sheets forming the dielectric layers 11, using the conductive paste by a printing method such as a screen printing method or a gravure printing method.

The ceramic green sheets on which the internal electrodes are printed may be alternately stacked and sintered, thereby forming the ceramic body.

Although pattern shapes of the first and second internal electrodes 31 and 32 are illustrated in FIG. 5, the pattern shapes are not limited thereto, and may be variously changed.

The capacitor may serve to control a voltage supplied from a power management integrated circuit (PMIC).

The composite electronic component 100 according to the exemplary embodiment may include an input terminal 151 disposed on the first end surface of the composite body 130 in the length direction and connected to the coil part 140 of the inductor 120, an output terminal 152 including a first output terminal 152a disposed on the second end surface of the composite body 130 in the length direction and connected to the coil part 140 of the inductor 120 and a second output terminal 152b disposed on the second end surface of the composite body 130 in the length direction and connected to the first internal electrodes 31 of the capacitor 110, and a ground terminal 153 disposed on the first end surface of the composite body 130 in the length direction and connected to the second internal electrodes 32 of the capacitor 110.

The input terminal 151 and the first output terminal 152a may be connected to the coil part 140 of the inductor 120, thereby serving as an inductor in the composite electronic component.

In addition, the second output terminal 152b may be connected to the first internal electrodes 31 of the capacitor 110 and the second internal electrodes 32 of the capacitor 110 may be connected to the ground terminal 153, thereby serving as the capacitor in the composite electronic component.

The input terminal 151, the output terminal 152, and the ground terminal 153 may be formed of a conductive paste containing a conductive metal.

The conductive metal may be nickel (Ni), copper (Cu), tin (Sn), or alloys thereof, but is not limited thereto.

The conductive paste may further contain an insulating material. For example, the insulating material may be glass, but is not limited thereto.

A method of forming the input terminal 151, the output terminal 152, and the ground terminal 153 is not particularly limited. That is, the input terminal 151, the output terminal 152, and the ground terminal 153 may be formed by dipping the composite body, or may be formed by another method such as a printing method, a plating method, or the like.

Figure 6:
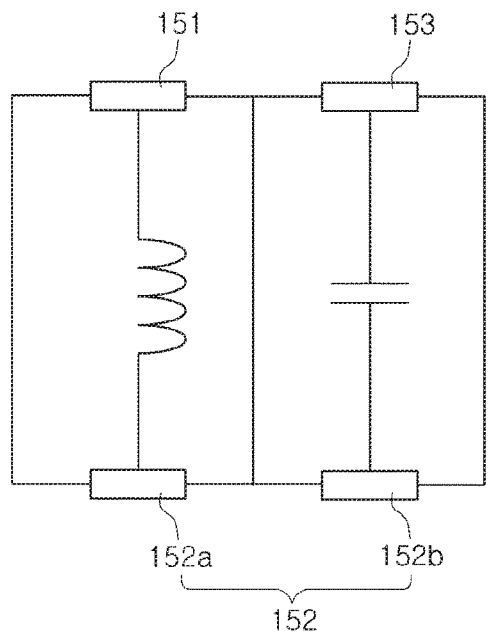
FIG. 6 is an equivalent circuit diagram of the composite electronic component illustrated in FIG. 1.

FIG. 6 is an equivalent circuit diagram of the composite electronic component illustrated in FIG. 1.

Referring to FIG. 6, in the composite electronic component according to the exemplary embodiment, since the inductor 120 and the capacitor 110 are coupled to each other unlike in the related art, the inductor 120 and the capacitor 110 may be designed to have a shortest distance therebetween, and thus noise may be decreased.

In addition, since the inductor 120 and the capacitor 110 are coupled to each other, a mounting area in the PMIC may be significantly decreased, and thus a space in which the inductor 120 and the capacitor 110 are mounted may be easily secured.

In addition, a cost required for mounting the composite electronic component may be reduced.

As electronic devices include various functions, the number of direct current (DC) to DC converters included in the PMIC has increased. In addition, the number of passive elements that should be included in a power input terminal and a power output terminal of the PMIC has also increased.

In this case, a component disposition area of the electronic device must be increased, which may limit miniaturization of the electronic device.

In addition, significant noise may be generated due to wiring patterns of the PMIC and peripheral circuits of the PMIC.

In order to solve the above-mentioned problems, research into a composite electronic component in which an inductor and a capacitor are vertically coupled to each other has been conducted, and thus effects such as a decrease in a component disposition area in the electronic device and suppression of noise generation have been obtained.

However, when the inductor and the capacitor are vertically disposed as described above, magnetic flux generated in the inductor may influence the internal electrodes of the capacitor, and thus a problem in which a self resonant frequency (SRF) moves toward a low frequency may occur.

When the SRF moves toward the low frequency as described above, a frequency region of the inductor that may be used in an exemplary embodiment may become narrow.

That is, since a function of the inductor is not exhibited in a high frequency region of the SRF or more, when the SRF moves toward the low frequency, a usable frequency region may be limited.

However, according to the exemplary embodiment, since the capacitor 110 may be coupled to the side surface of the inductor 120, an influence of the magnetic flux generated in the inductor on the internal electrodes of the capacitor may be significantly decreased, thereby preventing a change in the SRF.

That is, according to the exemplary embodiment, the inductor 120 and the capacitor 110 may be designed to have the shortest distance therebetween. Therefore, noise may be decreased, and the change in the SRF may be prevented, and thus a range of the inductor that may be used in the low frequency may not be limited.

In accordance with the miniaturization of the composite electronic component, an internal magnetic layer blocking a magnetic field of the inductor may also be thinned, and thus a quality (Q) factor may be deteriorated.

The Q factor is defined as loss of an element or a decrease in efficiency of the element. A high Q value means that loss is low and efficiency is high.

That is, according to the exemplary embodiment, the capacitor 110 may be coupled to the side surface of the inductor 120, and thus influences of the respective components on each other may be significantly decreased, thereby preventing the Q factor of the component from being deteriorated.

Figure 7:
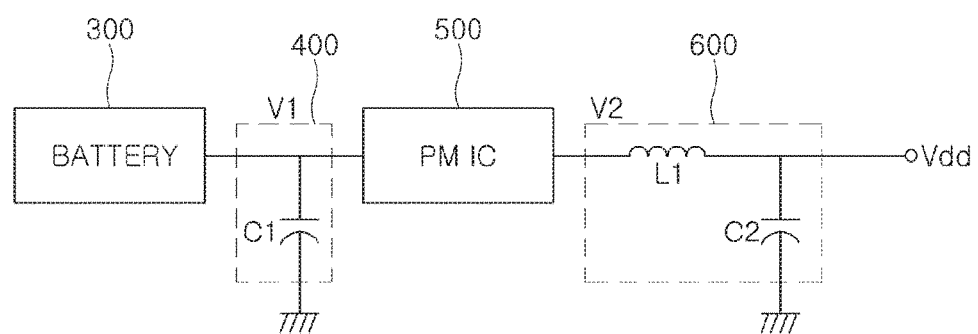
FIG. 7 is a diagram illustrating a driving power supply system supplying driving power to a predetermined terminal requiring driving power through a battery and a power management part.

FIG. 7 is a diagram illustrating a driving power supply system supplying driving power to a predetermined terminal requiring driving power through a battery and a power management part.

Referring to FIG. 7, the driving power supply system may include a battery 300, a first power stabilization part 400, a power management part 500, and a second power stabilization part 600.

The battery 300 may supply power to the power management part 500. Here, the power supplied to the power management part 500 by the battery 300 will be defined as a first power.

The first power stabilization part 400 may stabilize the first power V1 and supply the stabilized first power to the power management part. In detail, the first power stabilization part 400 may include a capacitor C1 formed between a connection terminal between the battery 300 and the power management part 500 and a ground. The capacitor C1 may decrease noise included in the first power.

In addition, the capacitor C1 may be charged with electric charges. Further, in a case in which the power management part 500 instantaneously consumes a large amount of current, the capacitor C1 may discharge the electric charges charged therein, thereby suppressing voltage variation in the power management part 500.

The capacitor C1 may be a high capacitance capacitor in which the number of stacked dielectric layers is 300 or more.

The power management part 500 may serve to convert power supplied to an electronic device into power suitable for the electronic device, and may distribute, charge, and control the power. Therefore, the power management part 500 may generally include a direct current (DC) to DC converter.

In addition, the power management part 500 may be implemented by a power management integrated circuit (PMIC).

The power management part 500 may convert the first power V1 into a second power V2. The second power V2 may be required by an active element such as an integrated circuit (IC), or the like, connected to an output terminal of the power management part 500 to receive driving power from the power management part 500.

The second power stabilization part 600 may stabilize the second power V2 and transfer the stabilized second power to an output terminal Vdd. An active element such as an integrated circuit (IC), or the like, receiving the driving power from the power management part 500 may be connected to the output terminal Vdd.

In detail, the second power stabilization part 600 may include an inductor L1 connected in series with the power management part 500 and the output terminal Vdd between the power management part 500 and the output terminal Vdd. In addition, the second power stabilization part 600 may include a capacitor C2 formed between a connection terminal between the power management part 500 and the output terminal Vdd and a ground.

The second power stabilization part 600 may decrease noise included in the second power V2.

In addition, the second power stabilization part 600 may stably supply power to the output terminal Vdd.

The inductor L1 may be a power inductor that may be applied to a large amount of current.

The power inductor may be defined as a high efficiency inductor of which a change in inductance is smaller than that of a general inductor when a direct current is applied thereto. That is, it may be considered that the power inductor has DC bias characteristics (characteristics that an inductance thereof changes depending on the DC current when the DC current is applied thereto) in addition to functions of the general inductor.

In addition, the capacitor C2 may be a high capacitance capacitor.

Figure 8:
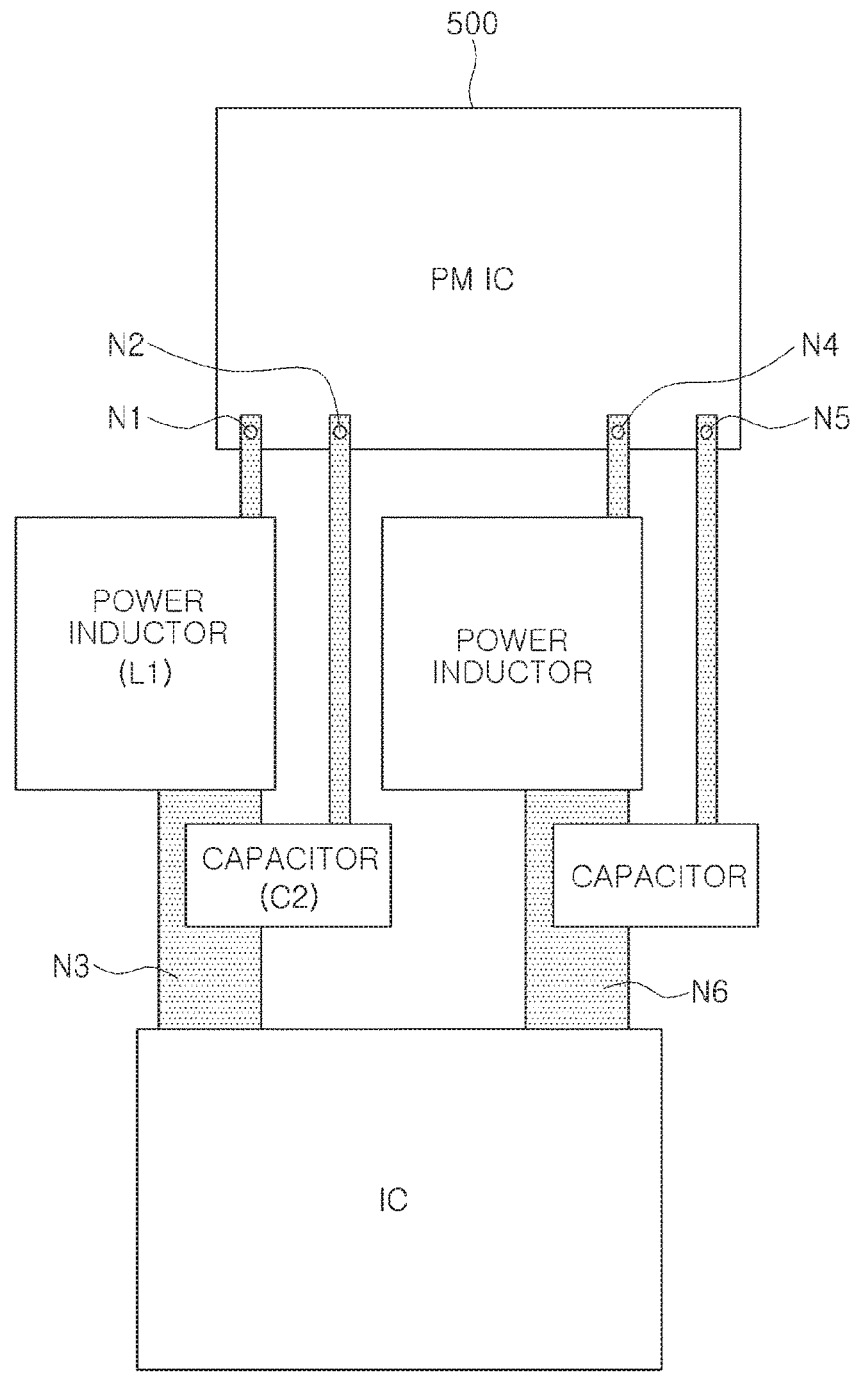
FIG. 8 is a diagram illustrating a pattern in which the driving power supply system is disposed.

FIG. 8 is a diagram illustrating a pattern in which the driving power supply system is disposed.

Referring to FIG. 8, a pattern in which the power management part 500, the power inductor L1, and the second capacitor C2 are disposed may be confirmed.

Generally, the power management part (PMIC) 500 may include several to several tens of DC to DC converters.

Further, in order to implement a function of the DC to DC converter, a power inductor and a high capacitance capacitor may be required in each of the DC to DC converters.

Referring to FIG. 8, the power management part 500 may have predetermined terminals N1 and N2. The power management part 500 may receive power from the battery and convert the power using the DC to DC converter. In addition, the power management part 500 may supply the converted power through the first terminal N1. The second terminal N2 may be a ground terminal.

Here, the first power inductor L1 and the second capacitor C2 may receive power from the first terminal N1, stabilize the power, and supply driving power through a third terminal N3. Therefore, the first power inductor L1 and the second capacitor C2 may serve as the second power stabilization part.

Since fourth to sixth terminals N4 to N6 shown in FIG. 8 perform the same functions as those of the first to third terminals N1 to N3, a detailed description thereof will be omitted.

Figure 9:
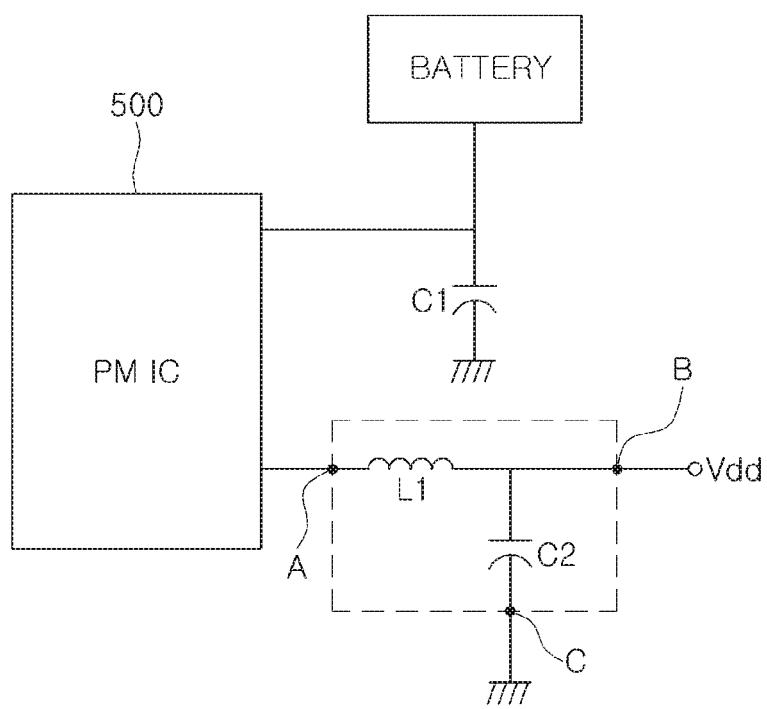
FIG. 9 is a circuit diagram of the composite electronic component according to the exemplary embodiment in the present disclosure.

FIG. 9 is a circuit diagram of the composite electronic component according to an exemplary embodiment.

Referring to FIG. 9, the composite electronic component may include an input terminal part A (input terminal), a power stabilization part, an output terminal part B (output terminal), and a ground terminal part C (ground terminal).

The power stabilization part may include a power inductor L1 and a second capacitor C2.

The composite electronic component may be an element capable of serving as the second power stabilization part described above.

The input terminal part A may receive power converted by the power management part 500.

The power stabilization part may stabilize power supplied from the input terminal part A.

The output terminal part B may supply the stabilized power to an output terminal Vdd.

The ground terminal part C may connect the power stabilization part to a ground.

Meanwhile, the power stabilization part may include the power inductor L1 connected between the input terminal part A and the output terminal part B and the second capacitor C2 connected between the ground terminal part C and the output terminal part.

Referring to FIG. 9, the power inductor L1 and the second capacitor C2 share the output terminal part B with each other, whereby an interval between the power inductor L1 and the second capacitor C2 may be decreased.

As described above, the composite electronic component may be formed by implementing the power inductor and the high capacitance capacitor provided in an output power terminal of the power management part 500 as a single component. Therefore, in the composite electronic component, a degree of integration of the elements is improved.

Figure 10:
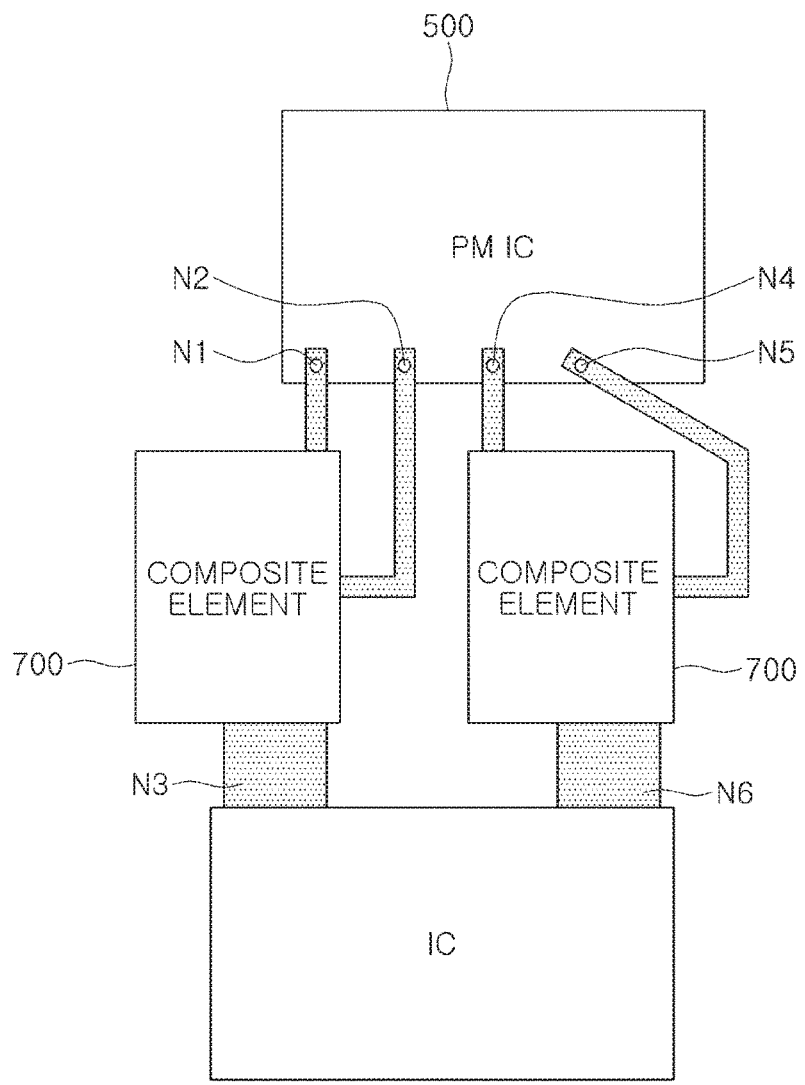
FIG. 10 is a diagram illustrating a pattern in which a driving power supply system using the composite electronic component according to the exemplary embodiment in the present disclosure is disposed.

FIG. 10 is a diagram illustrating a pattern in which a driving power supply system using the composite electronic component according to the exemplary embodiment is disposed.

As shown in FIG. 10, the second capacitor C2 and the power inductor L1 illustrated in FIG. 8 have been replaced by the composite electronic component according to the exemplary embodiment.

As described above, the composite electronic component may serve as the second power stabilization part.

In addition, the second capacitor C2 and the power inductor L1 are replaced by the composite electronic component according to the exemplary embodiment, whereby a length of a wiring may be significantly decreased. In addition, the number of elements disposed in the driving power supply system is decreased, and thus the elements may be optimally disposed.

That is, according to the exemplary embodiment, the power management part, the power inductor, and the high capacitance capacitor may be disposed as closely to each other as possible, and the wiring of the power line may be designed to be short and thick, and thus noise may be decreased.

In addition, according to the exemplary embodiment, two components (the second capacitor and the power inductor) are implemented as the single composite electronic component, and thus a mounting area in a printed circuit board (PCB) may be decreased. According to the present embodiment, the mounting area may be decreased by about 30% to 60% as compared to an existing disposition pattern.

Further, according to the exemplary embodiment, the power management part 500 may supply power to the IC receiving driving power by the smallest wiring.

Further, in the composite electronic component according to the exemplary embodiment, since the capacitor is disposed at the side surface of the inductor, the influence of the magnetic flux generated in the inductor on the internal electrodes of the capacitor may be significantly decreased, and thus the change in the self resonant frequency (SRF) may be prevented.

Further, in the composite electronic component according to the exemplary embodiment, the capacitor may be disposed at the side surface of the inductor, and thus deterioration of the Q factor of the component may be prevented.

Board Having Composite Electronic Component

Figure 11:
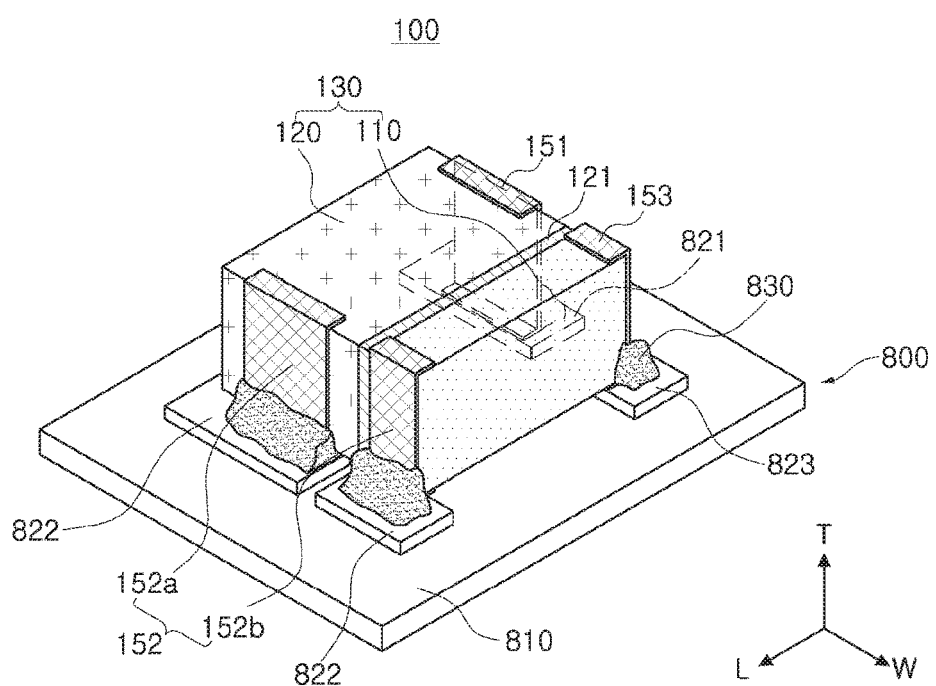
FIG. 11 is a perspective diagram illustrating a board in which the composite electronic component of FIG. 1 is mounted on a printed circuit board.

FIG. 11 is a perspective diagram illustrating a board in which the composite electronic component of FIG. 1 is mounted on a printed circuit board.

Referring to FIG. 11, a board 800 having a composite electronic component 100 according to the present exemplary embodiment may include a printed circuit board 810 on which the composite electronic component 100 is mounted, and three or more electrode pads 821, 822 and 823 formed on an upper surface of the printed circuit board 810.

The electrode pads may be first to third electrode pads 821, 822 and 823 connected to the input terminal 151, the output terminal 152, and the ground terminal 153 of the composite electronic component, respectively.

In this case, the composite electronic component 100 may be electrically connected to the printed circuit board 810 by solders 830 in a state in which the input terminal 151, the output terminal 152, and the ground terminal 153 of the composite electronic component 100 are positioned to contact the first to third electrode pads 821, 822 and 823, respectively.

As set forth above, according to exemplary embodiments, the composite electronic component capable of decreasing the component mounting area in the driving power supply system may be provided.

In addition, according to exemplary embodiments, the composite electronic component capable of suppressing noise from being generated in the driving power supply system may be provided.

Further, in the composite electronic component according to an exemplary embodiment, since the capacitor is disposed at the side surface of the inductor, the influence of the inductor on the internal electrodes of the capacitor may be significantly decreased, and thus the change in the self resonant frequency (SRF) may be prevented.

Further, in the composite electronic component according to an exemplary embodiment, the capacitor may be disposed at the side surface of the inductor, and thus deterioration of the Q factor of the component may be prevented.

According to the exemplary embodiment, since the inductor and the capacitor may be coupled to each other by the adhesive containing the first epoxy resin including the urethane modified epoxy (UME) resin, the second epoxy resin including the bisphenol A type resin, and the latent curing agent, at the time of adhesion, workability may be excellent, and the curing rate of the adhesion composition may be controlled.

Particularly, coupling adhesion strength of the inductor and the capacitor may be improved, and the latent curing agent and the bisphenol A type resin are contained in the adhesive, and thus workability may be excellent.

While exemplary embodiments have been shown and described above, it will be apparent to those skilled in the art that modifications and variations could be made without departing from the scope of the present invention as defined by the appended claims.

What is claimed is:

1. A composite electronic component comprising:
a composite body in which a capacitor and an inductor are coupled to each other, the capacitor including a ceramic body in which a plurality of dielectric layers and first and second internal electrodes disposed to face each other with at least one among the plurality of dielectric layers interposed therebetween are stacked, and the inductor including a magnetic body including a coil part;
a first terminal disposed on a first end surface of the composite body in a length direction and connected to the coil part of the inductor;
a second terminal including a first output terminal disposed on a second end surface of the composite body in the length direction and connected to the coil part of the inductor and a second output terminal disposed on the second end surface of the composite body in the length direction and connected to the first internal electrodes of the capacitor; and
a third terminal disposed on the first end surface of the composite body in the length direction and connected to the second internal electrodes of the capacitor,
wherein the inductor and the capacitor are coupled to each other by an adhesive containing a first epoxy resin including a urethane modified epoxy (UME) resin, a second epoxy resin including a bisphenol A type resin, and a latent curing agent, and
wherein the first and second internal electrodes of the capacitor are disposed in parallel to a winding axis of the coil part of the inductor.

2. The composite electronic component of claim 1, wherein the bisphenol A type resin is a bisphenol A diglycidyl ether resin.

3. The composite electronic component of claim 1, wherein the latent curing agent is dicyandiamide.

4. The composite electronic component of claim 1, wherein the adhesive further contains an imidazole based curing accelerator.

5. The composite electronic component of claim 4, wherein the imidazole based curing accelerator is 2-ethyl-4-methylimidazole (2E4MZ).

6. The composite electronic component of claim 1, wherein the magnetic body has a plurality of magnetic layers having conductive patterns formed thereon arranged in a stack, the conductive patterns configuring the coil part.

7. The composite electronic component of claim 1, wherein the magnetic body includes an insulating substrate and a coil formed on at least one surface of the insulating substrate.

8. The composite electronic component of claim 1, wherein the magnetic body includes a core and winding coils wound around the core.

9. The composite electronic component of claim 1, wherein the capacitor is coupled to a side surface of the inductor.

10. A composite electronic component comprising:
a first terminal receiving power converted by a power management part;
a power stabilization part stabilizing power and including a composite body in which a capacitor and an inductor are coupled to each other, the capacitor including a ceramic body in which a plurality of dielectric layers and first and second internal electrodes disposed to face each other with at least one among the plurality of dielectric layers interposed therebetween are stacked, the inductor including a magnetic body including a coil part, and the inductor and the capacitor being coupled by an adhesive containing a first epoxy resin including a urethane modified epoxy (UME) resin, a second epoxy resin including a bisphenol A type resin, and a latent curing agent;
a second terminal supplying the stabilized power; and
a third terminal for grounding,
wherein the first and second internal electrodes of the capacitor are disposed in parallel to a winding axis of the coil part of the inductor.

11. The composite electronic component of claim 10, wherein the first terminal is disposed on a first end surface of the composite body in a length direction, the second terminal includes a first output terminal disposed on a second end surface of the composite body in the length direction and connected to the coil part of the inductor and a second output terminal disposed on the second end surface of the composite body in the length direction and connected to the first internal electrodes of the capacitor, and
the third terminal is disposed on the first end surface of the composite body in the length direction and connected to the second internal electrodes of the capacitor.

12. The composite electronic component of claim 10, wherein the capacitor is coupled to a side surface of the inductor.

13. The composite electronic component of claim 10, wherein the bisphenol A type resin is a bisphenol A diglycidyl ether resin.

14. The composite electronic component of claim 10, wherein the latent curing agent is dicyandiamide.

15. The composite electronic component of claim 10, wherein the adhesive further contains an imidazole based curing accelerator.

16. The composite electronic component of claim 15, wherein the imidazole based curing accelerator is 2-ethyl-4-methylimidazole (2E4MZ).

* * * * *